United States Patent [19]

Hogan

[11] Patent Number: 4,564,720
[45] Date of Patent: Jan. 14, 1986

[54] PURE SILVER OHMIC CONTACTS TO N- AND P- TYPE GALLIUM ARSENIDE MATERIALS

[75] Inventor: Stephen J. Hogan, Golden, Colo.

[73] Assignee: The United States of America as represented by the United States Department of Energy, Washington, D.C.

[21] Appl. No.: 494,485

[22] Filed: May 13, 1983

[51] Int. Cl.⁴ .................. H01L 31/04; H01L 31/18
[52] U.S. Cl. .................. 136/256; 29/572; 29/589; 136/262; 357/30; 357/65; 427/88
[58] Field of Search .................. 29/572, 589–591; 427/74, 88; 136/256, 262; 357/30, 65

[56] References Cited

U.S. PATENT DOCUMENTS

| 3,264,707 | 8/1966 | Elie | 29/572 |
| 3,669,655 | 6/1972 | Cox et al. | 420/501 |
| 4,301,188 | 11/1981 | Niehaus | 427/88 |

OTHER PUBLICATIONS

H. J. Hovel et al., "Ohmic Contact to GaAs-Based Devices," IBM Tech. Disc. Bull., vol. 21, p. 2125, (1978).
T. Sanada et al., "Ohmic Contacts to p-GaAs with Au/Zn/Au Structure," Jap. J. Appl. Phys., vol. 19, pp. L491–L494, (1980).
J. Appl. Phys., vol. 52, pp. 1127–1129, (1981).
IEEE Trans. Parts, Hybrids & Packaging, vol. PHP-8, pp. 49–50 (1972).
Semiconductors & Semimetals, vol. 15, Chapter 1, pp. 1–38.
J. Vac. Sci. Technol., vol. 21, pp. 6–13, (1982).
J. Electrochem. Soc., vol. 116, pp. 507–508, 709–711, (1969).
IEEE Trans. Electron Devices, vol. ED-30, pp. 39–44, (1983).
Int. J. Electronics, vol. 47, pp. 459–467, (1979).
Solid-State Electronics, vol. 1, pp. 97–106, (1960).
Solid-State Electronics, vol. 10, pp. 1213–1219, (1967).
Solid-State Electronics, vol. 14, pp. 541–550, (1971).
J. Vac. Sci. Technol., vol. 19, pp. 303–307, (1981).
Conference Record, 14th IEEE Photovoltaic Specialists Conf. (1980), pp. 337–340.
Conference Record, 14th IEEE Photovoltaic Specialists Conf. (1980), pp. 1098–1101.
Electronics Letters, vol. 18, No. 22, pp. 918–919, (1982).
Instrum. Exp. Tech., (U.S.S.R.), No. 3, pp. 728–729, (1965).
"Ohmic Contacts to Semiconductors", pp. 102–114, Electrochem. Soc., N.Y., (1969).
N. Braslan, PCS-10, Sante Fe, N.M., (Jan. 1983), pp. 1–7.
Contractor Report-SAND 82-7105, (1982).

Primary Examiner—Aaron Weisstuch
Attorney, Agent, or Firm—Kenneth L. Richardson; John M. Albrecht; Judson R. Hightower

[57] ABSTRACT

Disclosed is an improved process for manufacturing gallium arsenide semiconductor devices having as its components an n-type gallium arsenide substrate layer and a p-type gallium arsenide diffused layer. The improved process comprises forming a pure silver ohmic contact to both the diffused layer and the substrate layer, wherein the n-type layer comprises a substantially low doping carrier concentration.

4 Claims, 1 Drawing Figure

PURE SILVER OHMIC CONTACTS TO N- AND P-TYPE GALLIUM ARSENIDE MATERIALS

CONTRACTUAL ORIGIN OF THE INVENTION

The U.S. Government has rights in this invention pursuant to Contract No. EG-77-C-01-4042 between the U.S. Department of Energy and the Midwest Research Institute.

BACKGROUND OF THE INVENTION

1. Field of the Invention

The present invention relates generally to gallium arsenide solar cells, and more particularly to forming pure silver ohmic contacts to both n-type gallium arsenide semiconductor materials with substantially low doping carrier concentrations and p-type gallium arsenide materials.

2. Description of the Prior Art

It is important for gallium arsenide solar cells which generate high current densities to have good ohmic contacts for efficient and reliable operation. The ohmic contact at a metal-semiconductor junction may be defined as one which exhibits linear current-voltage characteristics. A crucial property of the ohmic contact is its specific contact resistivity, that is electrical resistance between the contact and the semiconductor multiplied by the contact area. The specific resistivity of a good ohmic contact should be less than about $10^{-3}$ $\Omega cm^2$. The importance of good ohmic contacts becomes more significant when it is realized that to collect current within semiconductor solar cells, electrical connections must be made at the metal-semiconductor junctions, and that to maximize junction current flow, it is essential to use the lowest resistance contacts possible.

The formation of ohmic contacts for gallium arsenide cells which exhibit acceptable low resistance depends on many factors. Heretofore, one primary such factor was the use of a highly doped semiconductor at the interface under the contacting metal. With regard to this factor, it will be noted that the present invention contemplates forming pure silver ohmic contacts to the n-type gallium arsenide materials with fairly low doping densities, as will be more fully explained hereinafter. Moreover, a number of other factors such as surface preparation, metal deposition conditions, reproducibility, cost-effective contacting techniques, and satisfactory electrical characteristics must also be considered in the formation of superior quality ohmic contacts.

The requirements for selecting specific contacting metals for making ohmic contacts to gallium arsenide solar cells depends on many of the factors just previously mentioned. Generally, the most widely selected contacting metals are gold-base alloys. Gold alloys are frequently selected because they typically advantageously provide relatively good performing contacts with acceptable contact resistance.

However, in spite of this significant advantage, there are some major problems associated with gold-alloy contact systems, and these problems generally involve cost. For instance, the cost of virtually every step involved in the manufacture of gallium arsenide cells presently substantially exceeds the cost of the manufacturing steps of silicon solar cell counterparts by a large factor. To illustrate further, the alloying process step of gold contact systems normally contributes to the high manufacturing cost because the gold alloys often comprise complex multiple element systems. Consequently, they are fairly expensive to produce.

Similarly, the doping process step of gold contact systems also frequently contributes to the excessive manufacturing cost of this system. For example, as previously mentioned, to achieve ohmicity for the majority of gold-alloy contacts, the metal-semiconductor interface must necessarily be highly doped. Unfortunately, doping must necessarily be carefully performed since a heavy diffusion of donor or acceptor impurities can result in a deterioration of the underlying junction, which can eventually degrade solar performance. Consequently, this step is often costly, as well as time consuming.

Incidentally, it is to be noted that the high doping carrier concentrations at the semiconductor interface may also have a material effect in electrically degrading cell performance. This is so primarily because the lifetime and diffusion lengths of the minority carriers are appreciably decreased as the carrier concentrations are increased. The result, of course, is a reduction in current collection efficiency. In addition to the above production problems, it is also fairly expensive to manufacture gold-alloy contacts at high volumes.

Another major problem associated with some gold-alloy contact systems is aging. For instance, gold-alloy contacts which are made directly to the n-type surfaces are often subject to aging effects as a consequence of damage introduced into the n-type gallium arsenide materials by the alloying process. The effect of aging is generally to degrade the performance of the gallium arsenide cell. It also normally shortens the mean time of failure of the operational cell. Moreover, these conditions usually combine to adversely affect cell stability.

Still another problem is that the pure gold alloys generally possess poor wettability (nonwetting). Poor wetting causes the liquid gold alloys upon heating to stand up in the form of drops at the semiconductor interface instead of spreading, which gives rise to a high specific contact resistivity.

To cope with the aforesaid problems, particularly that of nonwetting, a layer of nickel is deposited over some gold-alloy contacts, such as gold-germanium, to suppress the balling-up effect. Unfortunately, nickel, despite its usefulness in enhancing wetting, is a fast diffuser in gallium arsenide materials, and therefore excessive amounts degrade the gold alloy contact performance.

Another approach to overcome the problems associated with gold-alloy contacts is to replace them with less expensive metal alloys. To this end, silver base alloys are commonly used as an alternative to gold-alloys essentially because they provide quality ohmicity to both n-type and p-type cells at fairly high doping carrier concentrations. Unfortunately, in virtually all silver-alloy contact systems, the complexity of the metallization process and the high cost associated with manufacturing them still remain a severe problem. Additionally, some silver-alloy contacts, such as tin-silver, tarnish when exposed to air. This problem is compounded when the contact is to be bonded by thermal compression to a heat sink.

In a similar approach, a number of pure metals have also been considered as alternative contact systems for gallium arsenide cells. Some of the most widely used pure metal contacts are molybdenum, chromium, titanium, tin, indium, gold, and silver. These metals are attractive because they usually form good performing ohmic contacts to either the p-or n-type materials. Unfortunately, most pure metal contact systems require substantially high levels of doping carrier concentrations to achieve ohmicity, and thus fail to satisfactorily solve the aforesaid associated problems concerning the reduction in current collection efficiency and the adverse effects of excessive diffusion of donors and acceptors during the doping process.

In this regard, it is reiterated that the present invention contemplates using pure silver to form ohmic contacts to the n-type gallium arsenide materials at substantially low density carrier concentrations, as well as to the p-type gallium arsenide materials. Heretofore, it has been well established that for superior quality ohmic contacts to be achieved for the n-type materials, a highly doped semiconductor interface was absolutely necessary. To this end, all known prior art teachings indicate that pure silver will form either rectifying contacts (nonohmic) or contacts with poor conductivity on gallium arsenide materials unless the carrier concentration is equal to or higher than $1 \times 10^{18}$ carriers/cm$^{-3}$ for n-types and $6 \times 10^{18}$ carriers/cm$^{-3}$ for p-types. Hence, applicant's ability to obtain good ohmic contacts with pure silver on n-type gallium arsenide materials at one order of magnitude lower than that taught by the prior art was totally unexpected, as will be more fully discussed hereinafter.

To continue, some pure metal contact systems such as molybdenum and chromium are problematic because they are extremely difficult to deposit. Some pure metal contact systems such as titanium and platinum are generally just as expensive as the gold alloy contact systems. Some pure indium contacts frequently have very low current drops at thresholds, and consequently are very unstable with time. Moreover, with the latter contacts failure by metal migration from the anode occurs rapidly. Notably, some pure tin contacts on bulk n-type materials often fail under bias by metal migration from the anode in the same way as pure indium contacts fail.

Some articles containing information relating to the forming of ohmic contacts for gallium arsenide semiconductor materials include: R. P. Gupta and J. Freyer, *Metallization systems for ohmic contacts to p- and n-type GaAs*, Int. J. Electronics, Vol. 47 No. 5, 459–467, July 1979; K. L. Kohn and L. Wandinger, *Variation of Contact Resistance of Metal-GaAs Contacts with Impurity Concentration and Its Device Implications*, J. Electrochem. Soc., Solid State Science, Vol. 116, No. 4 507–508, April 1969; H. Matino and M. Tokunaga, *Contact Resistances of Several Metals and Alloys to GaAs*, J. Electrochem. Soc., Electrochemical Technology, Vol. 116, No. 5, 709–711, May 1969; J. Palau, E. Testemale, Al Ismail, and L. Lassabatere, *Surface and contact properties of GaAs overlaid by silver*, J. Vac. Sci. Technol., Vol. 21, (1), 6–13, May-June 1982; and B. Schwartz, editor, *Ohmic Contacts to Semiconductors*, The Electrochemical Society, Inc., 1969.

Additionally, some articles containing information relating to the annealing process used in forming ohmic contacts for gallium arsenide semiconductors include: C. Lindstrom and P. Tihanyai, *Ohmic Contacts to GaAs Lasers Using Ion-Beam Technology*, IEEE Transaction on Electron Devices, Vol. ED-30, No. 1, 39–44, January 1983; B. L. Sharma, *Ohmic Contacts to III-V Compound Semiconductors*, Semiconductors and Semimetals, Vol. 15 1–39, 1981; and J. G. Werthen and D. R. Scifres, *Ohmic contacts to n-GaAs using low-temperature anneal*, J. Appl. Phys. 52(2), 1127–1129, February 1981.

SUMMARY OF THE INVENTION

Against the foregoing background, it is therefore a general object of the present invention to provide a process for forming pure silver ohmic contact systems for gallium arsenide devices which overcomes many of the aforesaid shortcomings and disadvantages of the prior art metallization systems.

It is another general object to provide an improved process for forming pure silver, low resistance, ohmic contacts on n- and p-type gallium arsenide semiconductor materials.

It is a further general object to provide a simplified process for fabricating pure silver contacts on p- and n-type gallium arsenide materials usable in the manufacture of solar cells and having acceptable electrical cell performance characteristics, structural performance characteristics, reproducibility, and stability.

It is a specific object of the present invention to provide an improved simplified process for fabricating pure silver, low resistance, ohmic contacts to n-type gallium arsenide materials at substantially low doping carrier concentrations.

It is another specific object of the present invention to use a vacuum evaporation deposition process in combination with an annealing process to achieve ohmic contacts with pure silver to both n-type gallium arsenide materials at substantially low doping carrier concentrations and p-type gallium arsenide materials.

It is still another specific object to provide pure silver, low resistance, ohmic contacts for gallium arsenide solar cells with doping carrier concentrations less than $1 \times 10^{18}$ cm$^{-3}$ for n-type gallium arsenide materials and less than $6 \times 10^{18}$ cm$^{-3}$ for p-type gallium arsenide materials.

It is yet another specific object to replace gold alloy ohmic contact systems for gallium arsenide solar cells with substantially less expensive metal contact systems that can be applied to n-type and p-type gallium arsenide materials with simplified processing techniques.

It is still another specific object to replace gold alloy ohmic contact systems for gallium arsenide solar cells with a cost-effective ohmic metal system which provides satisfactory electrical and structural cell performance characteristics that are substantially equal to those obtained with the gold alloy contact systems.

The above objects, as well as still further objects and advantages, are obtained from the present invention which may be briefly described as a method for manufacturing gallium arsenide semiconductor devices having as its components an n-type gallium arsenide substrate layer and a p-type gallium arsenide diffused layer. The method includes forming a pure silver ohmic contact on both the diffused layer and the substrate layer, wherein the n-type substrate layer comprises a substantially low doping carrier concentration.

Additional objects, advantages, and novel features of the present invention will be set forth in part in a detailed description that follows, and in part will become apparent to those skilled in the art upon examination of the following description or upon practice of the invention. The objects and advantages of the invention may be realized and obtained by means of the elements or a combination of elements particularly pointed out in the appended claims.

BRIEF DESCRIPTION OF THE DRAWINGS

The accompanying drawings, which are incorporated in and form part of the specification, illustrate preferred embodiments of the present invention and together with the description serve to explain the principles of the invention.

DETAILED DESCRIPTION OF THE PREFERRED EMBODIMENTS

Figure 1:
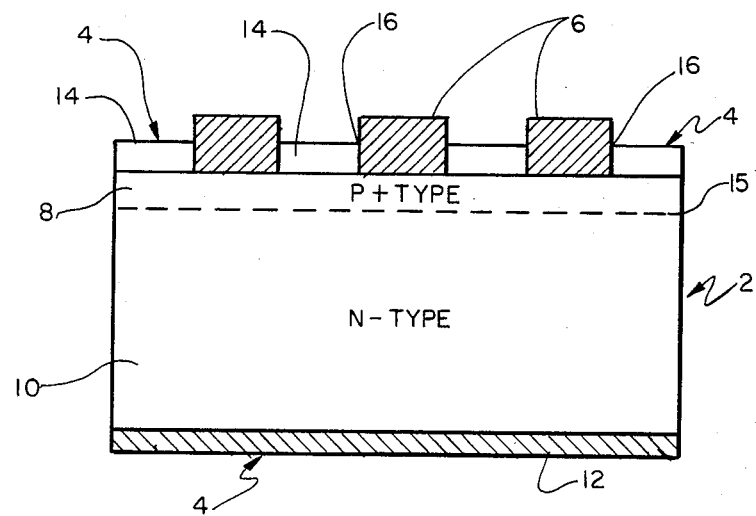
FIG. 1 is a schematic diagram of a gallium arsenide semiconductor solar cell constructed in accordance with the principles of the present invention.

Referring initially to FIG. 1, a gallium arsenide solar cell 2 is illustrated having a pure silver, low resistance, ohmic contact system which is generally denoted by the reference numeral 4. In the present form of the invention, the solar cell 2 includes a liquid phase epitaxially grown gallium-arsenide-aluminum window layer 14 approximately 2 $\mu$m thin, which is heavily doped with magnesium to a carrier concentration of about $1 \times 10^{19}$ $cm^{-3}$. The cell 2 further includes a p+ diffused layer 8 of about 3 $\mu$m to 4 $\mu$m deep on a commercially available gallium arsenide n-type substrate 10 which possesses fairly low carrier concentrations of about $3 \times 10^{17}$ $cm^{-3}$, a broad area back ohmic contact of pure silver 12, and a finger-type front ohmic contact of pure silver 6.

In practicing the inventive process, the substrate layer 10 is initially chemically polished, cleaned, and etched with a hydrofluoric acid. Thereafter, the p+ diffused layer 8 is formed by liquid phase epitaxially growing the window layer 14 on the substrate layer 10. To this end, the cell 2 is conventionally heated at a temperature range of from about 810° C. to about 820° C. for around about 10 minutes to effect diffusion of the magnesium from the window layer into the n-type substrate layer 10, and thereby to also effect forming the p-n junction 15. Although the diffused layer 8 is preferably formed using liquid phase epitaxial growth techniques, it should be understood that other suitable techniques for preparing the diffused layer and the p-n junction, such as chemical vapor deposition techniques, may be employed as will occur to those skilled in the art.

Following the formation of the window layer 14, photolithographic and photoresist techniques are utilized to define a front grid contact pattern. Afterwards, a plurality of channels 16 are etched in the window layer 14 for the contact grid pattern with a dilute hydrofluoric acid. Thereafter, the pure silver is deposited onto the bottom of the substrate layer 10 in any manner well known in the art so as to form the back contacts 12. The pure silver is next evaporated into the channels 16 under a vacuum in a range of from about $5 \times 10^{-6}$ to about $9 \times 10^{-6}$ Torr for a depth of approximately 1 $\mu$m thick.

Thereafter, pursuant to the inventive process, the two deposited pure silver contacts 6, 12 are subjected to an anneal to achieve ohmicity. To this end, the deposited contacts 6, 12 are treated with heat using a forming gas comprising about 10% hydrogen and about 90% nitrogen. The annealing temperatures are in a range of from about 430° C. to about 460° C. with the preferred annealing temperature being about 450° C. The annealing cycle is from about 8 minutes to about 10 minutes long.

The following examples serve to illustrate certain preferred embodiments of the present process invention, as well as serving to compare the electrical performances obtained from these embodiments with the electrical performances obtained from prior art gold alloy ohmic contacts used with gallium arsenide cells and are not to be construed as limiting the scope of the present invention.

EXAMPLE I

Three ohmic contact systems for gallium arsenide cells are presented by the first example. One is a pure silver contact system, and the remaining two are gold alloy contact systems, namely, gold-beryllium and gold-germanium-gold. The pure silver contacts were fabricated using evaporation deposition techniques and annealing techniques in accordance with the invention. The two gold-alloy contacts were similarly fabricated with modifications to effect ohmicity thereof.

To accomplish these objectives, gallium arsenide wafers were used for investigating the basic electrical characteristics of the three ohmic contact systems. Doping densities for the wafers were chosen to coincide with surface concentrations required in typical gallium arsenide photovoltaic devices. Hence, the doping carrier concentration of the n-type gallium arsenide wafers was $3 \times 10^{17}$ $cm^{-3}$ (tellurium doped). The doping carrier concentration of the p-type gallium arsenide wafers was $2 \times 10^{18}$ $cm^{-3}$ (zinc doped).

All the gallium arsenide wafers had the same cleaning cycle, being degreased and etched with a hydrofluoric acid prior to the deposition of the pure silver and the gold alloys. Thereafter, the pure silver and the two gold alloys were sequentially evaporated onto the wafers used. The silver was deposited using a conventional electron beam evaporator at a vacuum of between $5 \times 10^{-6}$ torr and $9 \times 10^{-6}$ torr. A layer of gold-beryllium alloy approximately 5 $\mu$m thick was evaporated onto each p-type wafer using resistance heating techniques. The gold-germanium-gold alloys were deposited onto the n-type wafers through successive evaporations of 100 Å, 1300 Å, and 2400 Å layers. It will be noted that the gold-beryllium contacts were not fabricated on the n-type wafers and the gold-germanium-gold contacts were not fabricated on the p-type wafers.

Thereafter, the deposited pure silver contacts and the deposited gold-alloy contacts were subjected to an anneal to achieve ohmicity. Ohmicity of the pure silver contacts was obtained at an annealing temperature of about 450° C. with an annealing cycle of about 10 minutes. Ohmicity of the two gold alloys was obtained at an annealing temperature of about 350° C. with an annealing cycle of about 15 minutes.

Thereafter, the contact resistivity of the three contact systems was measured so as to enable comparisons in the contact resistivities of the silver and the gold alloy ohmic contacts. All of the resistivity measurements were accomplished using conventional equations in a well known manner.

The following values of the contact resistivity were obtained by fabricating the aforedescribed pure silver and gold-alloy ohmic contacts on gallium arsenide semiconductor materials.

| Type of Ohmic Contact System | P—type GaAs ($\Omega$ $cm^2$) | N—type GaAs ($\Omega$ $cm^2$) |
| --- | --- | --- |
| Au(Be) | $5 \times 10^{-4}$ | |
| Au/Ge/Au | | $3 \times 10^{-4}$ |

| Type of Ohmic Contact System | P—type GaAs ($\Omega$ cm$^2$) | N—type GaAs ($\Omega$ cm$^2$) |
|---|---|---|
| Ag | $1 \times 10^{-4}$ | $4 \times 10^{-4}$ |

EXAMPLE II

Example II provides the averaged results of the current-voltage characteristics of 16 ohmic contact systems on gallium arsenide cells; 8 of the 16 being pure silver contacts, and the remaining 8 being gold-germanium contacts on the p+ gallium arsenide materials and gold-germanium-gold contacts on the n-type gallium arsenide materials. The current-voltage characteristics show the current-voltage relationship for the measured gallium arsenide cells and were accomplished for Example II using standard equations in a well-known manner.

The 16 ohmic contact systems were fabricated in substantially the same manner as the three contact systems of FIG. 1, one difference being that the gallium arsenide semiconductor structures used were cleaved solar cells. Another difference being that each cleaved n-type substrate included at least 4 cells. The last difference being that the p-type materials comprised magnesium doped diffused layers.

The following electrical characteristics were obtained by fabricating the aforesaid pure silver and gold alloy ohmic contacts on the n-type gallium arsenide semiconductor materials.

| Type of Contact System | Current Density mA-Cm$^2$ | Efficiency n(%) | Fill Factor $\overline{FF}$ | Series Resistivity $\rho_s(\Omega$ cm$^2)$ |
|---|---|---|---|---|
| Ag | 14.45 | 10.4 | 0.79 | 0.575 |
| Au Alloys | 14.48 | 10.2 | 0.77 | 0.756 |

From the foregoing, it may now be appreciated that the pure silver, upon being evaporated on low-doped n-type gallium arsenide semiconductor materials becomes ohmic after an anneal. Moreover, it may be further appreciated that the ohmicity obtained from such a pure silver contact system is usually substantially equal to the ohmicity realized from gold-base-alloy contact systems.

Furthermore, it will now be apparent that it was also both unexpected and surprising that applicant's simplified metallization process would attractively provide pure silver ohmic contacts on both low doped n-type and p-type gallium arsenide materials, which may effectively be substituted for gold-alloy ohmic contact systems with substantially no degradation of gallium arsenide device performance. Additionally, from the aforesaid, it will now be apparent that it was both unexpected and surprising that the vacuum evaporation deposition technique in combination with the annealing technique would provide a simplified metallization process, which advantageously provides a more cost-effective ohmic contact system for both p-type and n-type materials.

Additionally, it is evident that the ability to provide ohmic contacts for n-type gallium arsenide materials at fairly low doping densities indicates a promising potential for simplifying the doping processing step, as well as for minimizing electrical degradation due to the adverse effects of heavy doping concentrations on the life of the minority carriers. It is equally as evident that the ability to form ohmic contacts on the p-type gallium arsenide materials alone is not particularly advantageous due to the fact that the magnitude of the carrier concentrations is fairly normal. However, the ability to form pure silver contacts on both the n- and p-type materials is extremely advantageous since solar cell-type devices normally must necessarily employ both types of materials.

The foregoing description of the preferred embodiments of the present invention have been presented for purpose of illustration and description. It is not intended to be exhaustive or to limit the present invention to the precise forms disclosed, and obviously many modifications and variations are possible in the light of the above teaching.

The embodiments were chosen and described in order to best explain the principles of the invention and its practical application to thereby enable others skilled in the art to best utilize the invention and various embodiments and with various modifications as are suited to the particular use contemplated. It is intended that the scope of the invention be defined by the claims appended hereto.

The embodiments of the invention in which an exclusive property is claimed are defined as follows:

1. A process for manufacturing gallium arsenide devices having as its components an n-type gallium arsenide substrate layer and a p-type diffused layer, wherein the improvement comprises: depositing by vacuum evaporation a pure silver contact on both the diffused layer and the substrate layer; treating the deposited pure silver contacts with heat to effect ohmicity; and wherein the n-type substrate layer comprises a doping carrier concentration of less than $1 \times 10^{18}$ cm$^{-3}$ and the p-type diffused layer comprises a doping carrier concentration of less than $6 \times 10^{18}$ cm$^{-3}$.

2. A method as recited in claim 1, wherein said silver contacts are treated with heat a temperature of about 450° C. for about 10 minutes in a forming gas.

3. A gallium arsenide solar cell produced by the method of claim 1.

4. A gallium arsenide semiconductor device comprising: an n-type substrate layer, said n-type substrate layer being doped to doping carrier concentrations of less than $1 \times 10^{18}$ cm$^{-3}$; a p-type diffused layer doped to a doping carrier concentration of less than $6 \times 10^{18}$ cm$^{-3}$; and a pure silver ohmic contact system, and wherein said n-type layer includes a first pure silver ohmic contact thereon and said p-type layer includes a second pure silver ohmic contact thereon.

* * * * *